United States Patent
Morita et al.

(10) Patent No.: US 11,488,087 B2
(45) Date of Patent: Nov. 1, 2022

(54) REMANUFACTURING SUPPORT SERVER, BATTERY COLLECTING SUPPORT SERVER, BATTERY DATABASE MANAGEMENT SERVER, VENDOR COMPUTER, AND USER COMPUTER

(71) Applicant: KABUSHIKI KAISHA TOSHIBA, Minato-ku (JP)

(72) Inventors: Tomokazu Morita, Funabashi (JP); Yumi Fujita, Tokyo (JP); Nobukatsu Sugiyama, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 274 days.

(21) Appl. No.: 16/804,374

(22) Filed: Feb. 28, 2020

(65) Prior Publication Data

US 2021/0081875 A1 Mar. 18, 2021

(30) Foreign Application Priority Data

Sep. 17, 2019 (JP) .............................. JP2019-168432

(51) Int. Cl.
*G06Q 10/06* (2012.01)
*H01M 10/42* (2006.01)
(Continued)

(52) U.S. Cl.
CPC ..... *G06Q 10/06395* (2013.01); *G01R 31/367* (2019.01); *G01R 31/392* (2019.01);
(Continued)

(58) Field of Classification Search
CPC .......... G06Q 10/00–50/00; G07C 1/00–13/00; G01R 1/00–35/00; H01M 4/00–2300/00; G06F 1/00–40/00
(Continued)

(56) References Cited

U.S. PATENT DOCUMENTS 9,079,505 B1* 7/2015 Hyde ..................... G08G 1/202
9,406,982 B2* 8/2016 Obata ............... H01M 10/4207
(Continued)

FOREIGN PATENT DOCUMENTS

JP 5044862 B2 10/2012
JP 2014041768 A 3/2014
(Continued)

OTHER PUBLICATIONS https://global.toyota/jp/newsroom/corporate/20930377.html. "Start of demonstration of battery recycling and recycling business for electric vehicles", Chubu Electric Power Co., Inc. and Toyota Motor Corporation, Jan. 31, 2018, 5 pages (with English Machine Translation).

(Continued)

*Primary Examiner* — Alan S Miller
(74) *Attorney, Agent, or Firm* — Maier & Maier, PLLC

(57) ABSTRACT

According to one embodiment, a remanufacturing support server includes processor. The processor is configured to: acquire specification data representing required performance of a battery product; set an allowable range of a degradation state of a secondary battery to be used in the battery product; acquire diagnostic data indicating a diagnostic result of a degradation state of a secondary battery mounted on a vehicle, the diagnostic result of the degradation state of the secondary battery falling within the allowable range as the battery product; and provide an outside with a remanufacturing plan relating to the battery product based on the diagnostic data.

16 Claims, 7 Drawing Sheets

(51) Int. Cl.
*G01R 31/392* (2019.01)
*G01R 31/367* (2019.01)
*G07C 5/08* (2006.01)
*G06Q 30/02* (2012.01)
*G06F 16/245* (2019.01)
*G06F 16/22* (2019.01)
*G06Q 10/00* (2012.01)

(52) U.S. Cl.
CPC ............ *G06F 16/22* (2019.01); *G06F 16/245* (2019.01); *G06Q 10/30* (2013.01); *G06Q 30/0283* (2013.01); *G07C 5/0841* (2013.01); *H01M 10/4285* (2013.01); *H01M 2220/20* (2013.01)

(58) Field of Classification Search
USPC .................................................. 705/7.11–7.42
See application file for complete search history.

(56) References Cited

U.S. PATENT DOCUMENTS

| | | | | |
|---|---|---|---|---|
| 9,791,514 | B2* | 10/2017 | Nishizawa | G01R 31/385 |
| 10,013,678 | B2 | 7/2018 | Matsuyama et al. | |
| 10,203,373 | B1* | 2/2019 | Horst | G01R 31/343 |
| 10,220,718 | B2* | 3/2019 | Malik | B60L 53/68 |
| 2001/0028238 | A1* | 10/2001 | Nakamura | H01M 10/4242 |
| | | | | 320/132 |
| 2003/0209375 | A1* | 11/2003 | Suzuki | B60W 50/082 |
| | | | | 180/68.5 |
| 2005/0208347 | A1* | 9/2005 | Nagayama | H01M 10/4207 |
| | | | | 429/162 |
| 2007/0108946 | A1 | 5/2007 | Yamauchi et al. | |
| 2009/0322510 | A1* | 12/2009 | Berger | H04W 60/00 |
| | | | | 340/568.1 |
| 2011/0202418 | A1* | 8/2011 | Kempton | G06Q 20/22 |
| | | | | 705/26.1 |
| 2012/0074960 | A1* | 3/2012 | Minarcin | B60L 58/12 |
| | | | | 324/658 |
| 2012/0133337 | A1* | 5/2012 | Rombouts | G07F 15/005 |
| | | | | 320/155 |
| 2013/0085696 | A1* | 4/2013 | Xu | H04Q 9/00 |
| | | | | 702/63 |
| 2013/0090872 | A1* | 4/2013 | Kurimoto | H04Q 9/00 |
| | | | | 702/63 |
| 2014/0019001 | A1* | 1/2014 | Nishizawa | H01M 10/48 |
| | | | | 701/31.9 |
| 2014/0242420 | A1* | 8/2014 | Schaffner | G01R 31/382 |
| | | | | 429/50 |
| 2015/0093611 | A1* | 4/2015 | Obata | G01R 31/392 |
| | | | | 429/61 |
| 2015/0369867 | A1* | 12/2015 | Kanada | G01R 31/367 |
| | | | | 324/432 |
| 2017/0263984 | A1 | 9/2017 | Fujita et al. | |
| 2018/0290553 | A1* | 10/2018 | Malik | B60L 53/52 |
| 2019/0074960 | A1* | 3/2019 | Ravi | H04L 9/3239 |
| 2019/0087759 | A1* | 3/2019 | Ravi | G06Q 10/0631 |
| 2019/0160958 | A1* | 5/2019 | Chaudhary | B60L 53/665 |
| 2020/0058090 | A1* | 2/2020 | Zanarini | G06Q 10/0631 |
| 2020/0290477 | A1* | 9/2020 | Kurimoto | G06Q 50/06 |
| 2020/0294090 | A1 | 9/2020 | Morita et al. | |

FOREIGN PATENT DOCUMENTS

| | | |
|---|---|---|
| JP | 6128066 B2 | 5/2017 |
| JP | 6128220 B2 | 5/2017 |
| JP | 2017-166874 A | 9/2017 |
| JP | 2020-150687 A | 9/2020 |

OTHER PUBLICATIONS http://www.4renergy.com/company/about/, "What is 4R Energy", 4R Energy Corporation, 2014, 7 pages (with English Machine Translation).

http://www.4r-energy.com/news-release/uploads/2018/03/ リリース「浪江町における「使用済みEV用バッテリーの再製品化専用工場」の開業について」-R6.pdf, "About opening of "dedicated factory for remanufacturing used EV batteries" in Namie Town", Nissan Motor Corporation, et al., Mar. 26, 2018, 4 pages (with English Machine Translation).

Shoda, https://car.watch.impress.co.jp/docs/news/1113869.html, "4R Energy explains the business of the Namie Plant, which recycles rechargeable batteries for Leaf", Mar. 28, 2018 (with English Machine Translation), 17 pages.

Han et al., "Cycle Life of Commercial Lithium-Ion Batteries with Lithium Titanium Oxide Anodes in Electric Vehicles", Energies, vol. 7, 2014, 16 pages.

* cited by examiner

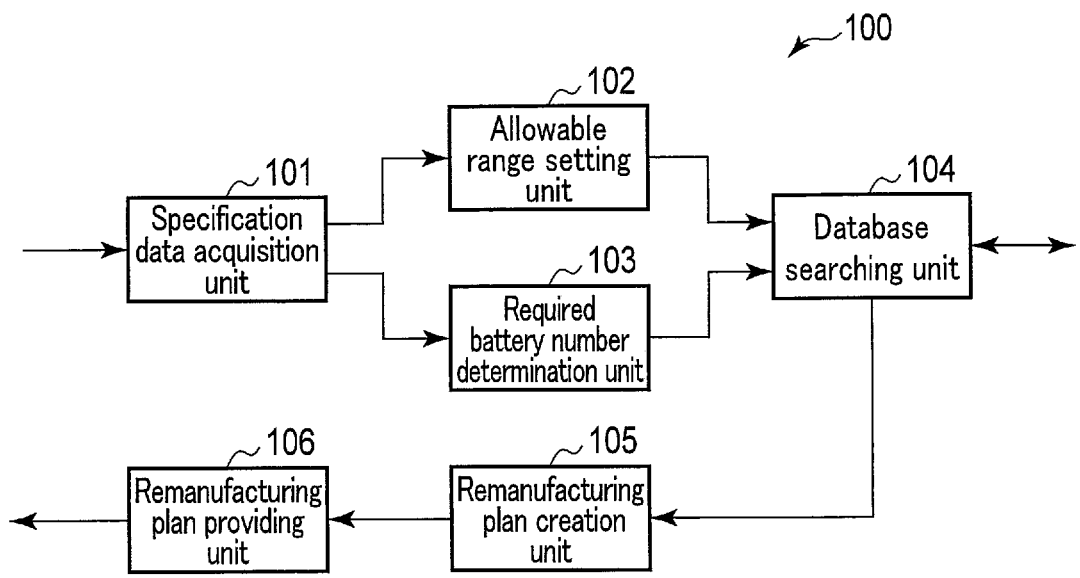
F I G. 2
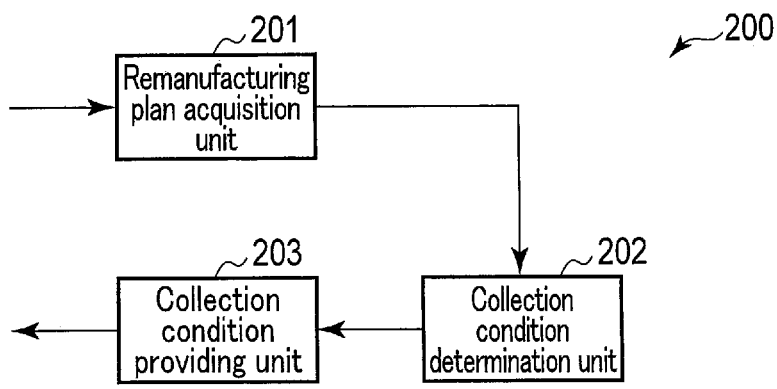
F I G. 3

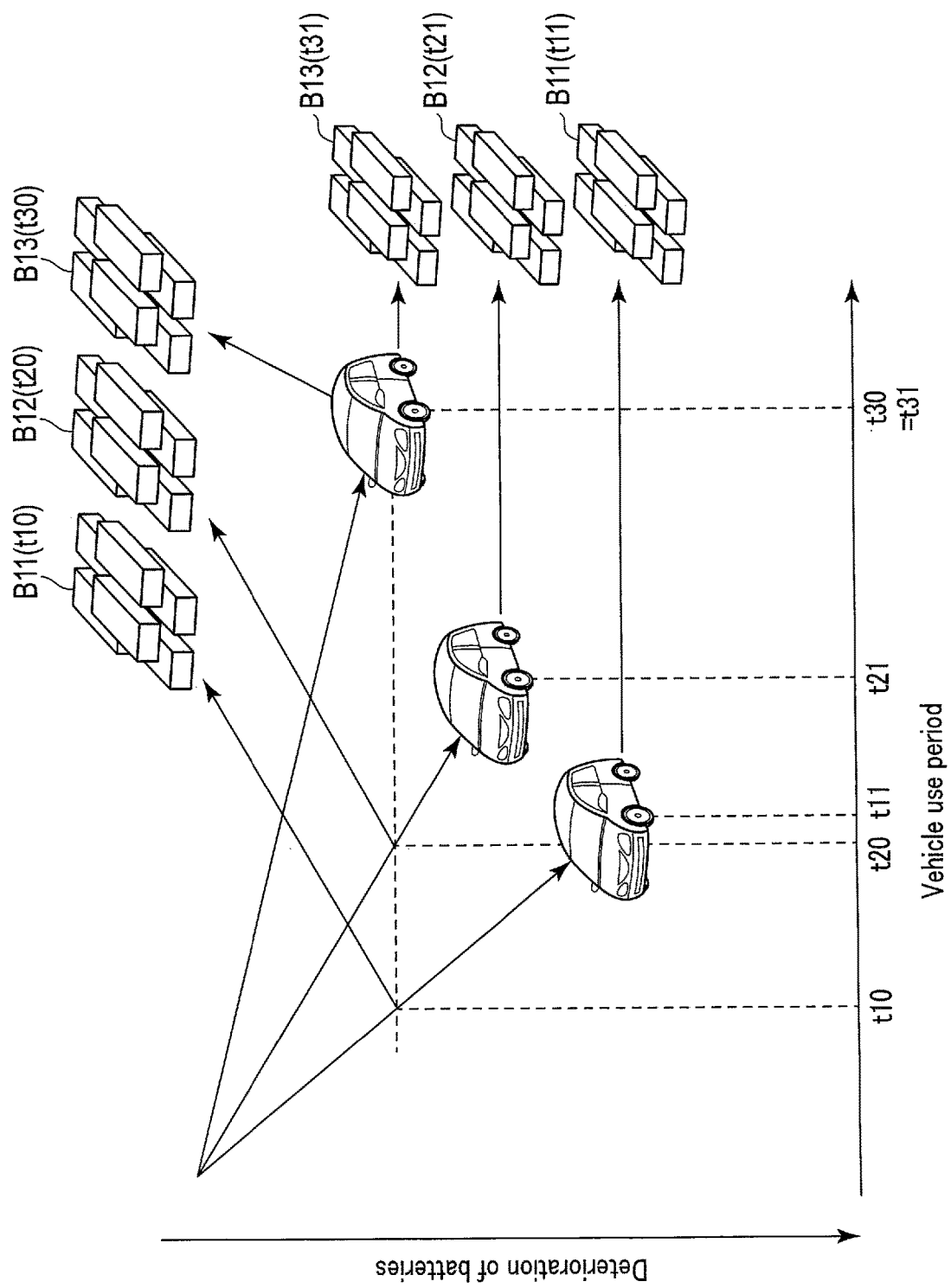
F I G. 6

REMANUFACTURING SUPPORT SERVER, BATTERY COLLECTING SUPPORT SERVER, BATTERY DATABASE MANAGEMENT SERVER, VENDOR COMPUTER, AND USER COMPUTER

CROSS-REFERENCE TO RELATED APPLICATION

This application is based upon and claims the benefit of priority from prior Japanese Patent Application No. 2019-168432, filed Sep. 17, 2019, the entire contents of which are incorporated herein by reference.

FIELD

Embodiments described herein relate generally to a remanufacturing support server, a battery collecting support server, a battery database management server, a vendor computer, and a user computer.

BACKGROUND

In the field of automobiles, there has recently been a worldwide shift from gasoline vehicles to electric vehicles (EV) and plug-in hybrid vehicles (PHEV), which are considered to be environmentally friendly. On the other hand, an attempt is being made to reuse lithium ion batteries (LIB) used in these vehicles as stationary storage batteries, for example.

Secondary batteries such as LIB may vary in degradation state depending on their use conditions such as vehicle operating conditions. For example, even secondary batteries mounted on vehicles of the same model or model year vary in degradation state when the batteries are collected, for example, when the vehicles are scrapped. It is thus necessary to analyze the performance of the collected secondary batteries for each module to group (grade) them, to select secondary batteries in accordance with requirements, and to assemble the selected secondary batteries into battery products.

BRIEF DESCRIPTION OF THE DRAWINGS

FIG. 2 is a block diagram illustrating the remanufacturing support server illustrated in FIG. 1.

FIG. 3 is a block diagram illustrating the battery collecting support server illustrated in FIG. 1.

FIG. 6 is a chart illustrating degradation states of different secondary batteries that can be collected by the secondary battery reuse system illustrated in FIG. 1.

DETAILED DESCRIPTION

According to one embodiment, a remanufacturing support server includes processor. The processor is configured to: acquire specification data representing required performance of a battery product; set an allowable range of a degradation state of a secondary battery to be used in the battery product; acquire diagnostic data indicating a diagnostic result of a degradation state of a secondary battery mounted on a vehicle, the diagnostic result of the degradation state of the secondary battery falling within the allowable range as the battery product; and provide an outside with a remanufacturing plan relating to the battery product based on the diagnostic data.

According to one embodiment, a battery collection support server includes processor. The processor is configured to: acquire a remanufacturing plan of a battery product including battery data of a secondary battery which is collectable to be used in the battery product; and provide a collection condition to collect a first secondary battery corresponding to first battery data included in the battery data of the collectable secondary battery, for an owner of the first secondary battery.

According to one embodiment, a battery database management server includes processor. The processor is configured to: acquires battery data including diagnostic data representing a diagnostic result of a degradation state of a secondary battery mounted on a vehicle; and registers the diagnostic data included in the battery data, in a database.

According to one embodiment, a vendor computer includes processor. In a secondary battery reuse system, the processor is configured to: transmit specification data representing required performance of a battery product to a remanufacturing support server; and receive from the remanufacturing support server a remanufacturing plan of the battery product which includes battery data of a secondary battery that is collectable to be used in the battery product and which is created using the specification data.

According to one embodiment, a user computer includes processor. In a secondary battery reuse system, the processor is configured to: transmits diagnostic data representing a diagnostic result of a degradation state of a secondary battery mounted on a vehicle to a battery database management server; and receiving from a battery collection support server a collection condition to collect the secondary battery of the vehicle, which is created using the diagnostic data.

Embodiments will be described below with reference to the drawings. Hereinafter, elements that are the same as or similar to those described already are denoted by the same or similar reference symbols, and their overlapping descriptions will basically be omitted.

EMBODIMENTS

Figure 1:
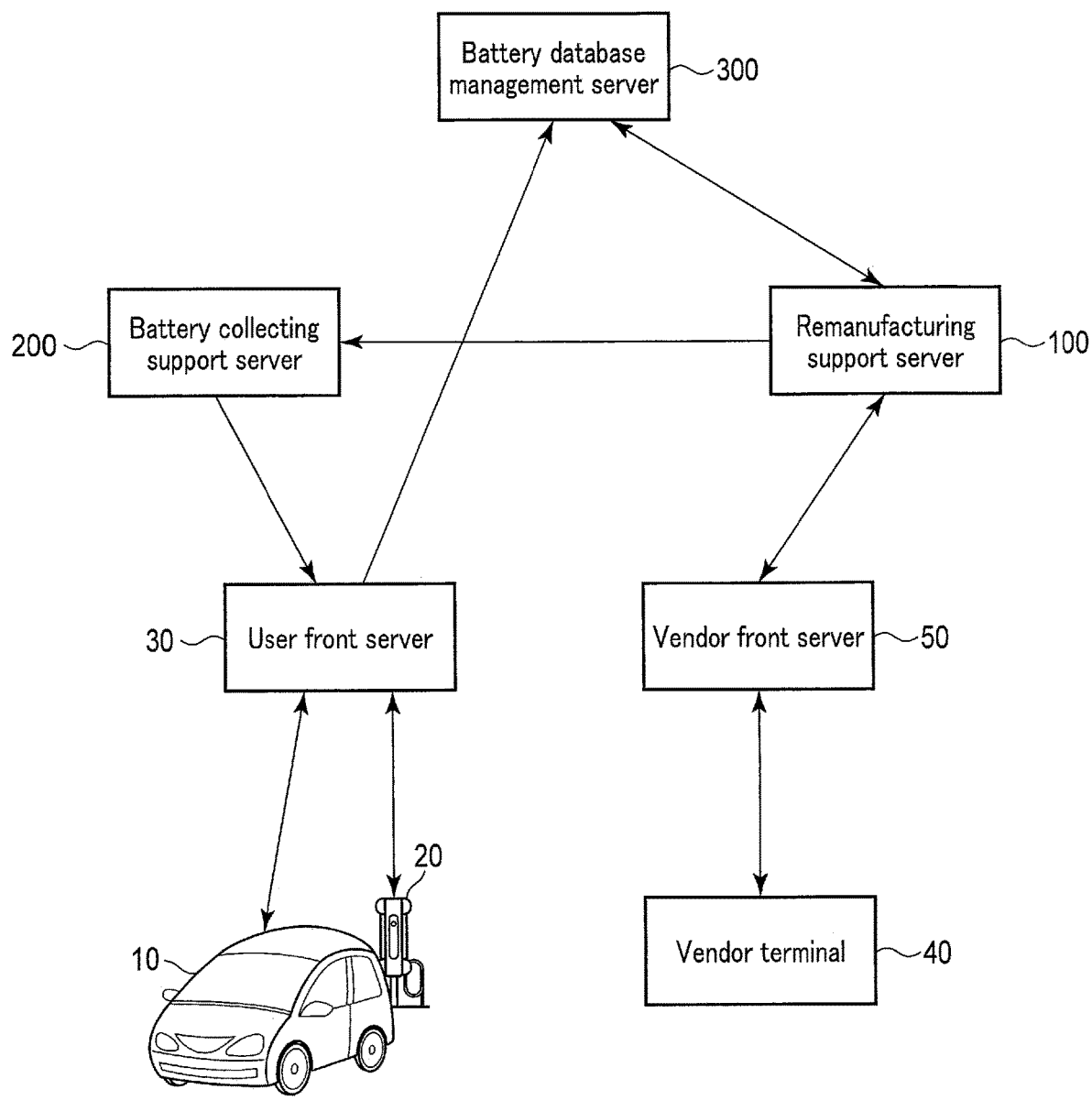
FIG. 1 is a block diagram illustrating a secondary battery reuse system including a remanufacturing support server, a battery collecting support server and a battery database management server according to an embodiment.

FIG. 1 is a block diagram illustrating a secondary battery reuse system including a remanufacturing support server, a battery collecting support server and a battery database management server according to an embodiment. As illustrated in FIG. 1, a remanufacturing support server 100, a battery collecting support server 200 and a battery database management server 300 according to the embodiment may be included in the secondary battery reuse system. In addition to these servers, an EV 10, a charging station (also referred to as a charging apparatus) 20, a user front server 30, a vendor terminal 40 and a vendor front server 50 may be included in the secondary battery reuse system. The secondary battery may mean, for example, a nonaqueous electrolyte secondary battery such as a lithium ion secondary battery or a battery module including a plurality of nonaqueous electrolyte secondary batteries.

Communications between the servers, between the EV 10 and/or the charging station 20 and the user front server 30 and between the vendor terminal 40 and the vendor front server 50 may be performed on a public network such as the Internet or on a private network.

Figure 5:
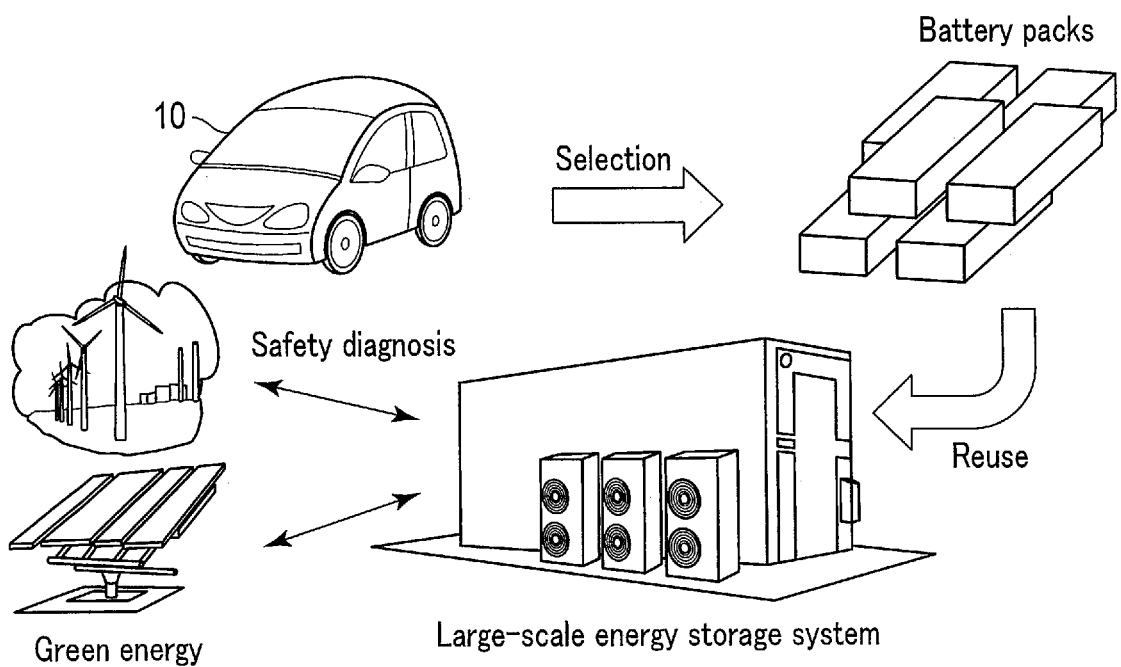
FIG. 5 is an illustration of a battery reuse system according to the embodiment in which an EV-mounted secondary battery is reused as a stationary storage battery.

The remanufacturing support server 100 receives, from the vendor terminal 40 via the vendor front server 50, specification data indicating performance requirements of a battery product which is planned to be remanufactured by a vendor using a used secondary battery as a member. While safety standards for secondary batteries installed in vehicles such as EVs are strictly defined so as not to cause serious accidents due to their malfunction, the same standards may not be required for secondary batteries installed in stationary storage batteries. Thus, for example, a business model as illustrated in FIG. 5 can be established in which a secondary battery having a predicted life at a certain level or higher, that is, a secondary battery with little degradation is selected and collected from the secondary batteries installed in the EV 10 and remanufactured as a stationary storage battery. FIG. 5 illustrates a battery reuse system according to the embodiment in which an EV-mounted secondary battery is reused as a stationary storage battery. The stationary storage battery can be used for storing green energy such as wind power and solar light in a large-scale energy storage system, for example.

On the basis of the specification data, the remanufacturing support server 100 determines the quality, quantity and the like of a secondary battery usable as a member of a target battery product (that is, a secondary battery for use in a target battery product). The remanufacturing support server 100 searches a battery database managed by the battery database management server 300 and confirms whether a secondary battery can be acquired as a member of a target battery product. If it can be acquired, the battery database management server 300 creates a remanufacturing plan relating to the target battery product and provides it for an outside source such as a vendor and a battery collecting agent. In addition, when the vendor agrees with the remanufacturing plan, the remanufacturing support server 100 provides the plan for the battery collecting support server 200 to collect the secondary battery in accordance with the plan.

The battery collecting support server 200 receives, from the remanufacturing support server 100, a remanufacturing plan for a battery product which is planned to be remanufactured by a vendor using a used secondary battery as a member. The battery collecting support server 200 determines collection conditions of a secondary battery usable as a member of a target battery product, such as an amount of money for the collection amount, which are specified by (the search result of the battery database included in) the remanufacturing plan, and provides the determined collection conditions for the owner of the secondary battery.

The battery database management server 300 manages a database which registers battery data of a secondary battery mounted on a vehicle using electricity as at least part of an energy source, such as an EV and a PHEV. For example, a vehicle mounted with a secondary battery (e.g. the EV 10), a charging station which charges the secondary battery (e.g. the charging station 20), a controller (not shown) of the secondary battery, or a terminal (not shown) of the owner of the secondary battery transmits battery data including the identifier of the secondary battery to the battery database management server 300 via the user front server 30. The battery database management server 300 receives the battery data and registers it in the battery database. The battery data may further include diagnostic data indicating a result of degradation diagnosis of the secondary battery obtained by the vehicle mounted with a secondary battery (e.g. the EV 10), the charging station which charges the secondary battery (e.g. the charging station 20), the controller (not shown) of the secondary battery, and the terminal (not shown) of the owner of the secondary battery. The degradation diagnosis of the secondary battery can be conducted using, for example, parameters estimated based on the charging curve analysis. The charging curve analysis is known in, for example, Jpn. Pat. Appln. KOKAI Publication No. 2017-166874. On the other hand, the battery database management server 300 searches the battery database in response to a search request from the remanufacturing support server 100, and returns a result of the search thereto.

The user front server 30 receives battery data of the secondary battery from, for example, the vehicle mounted with a secondary battery (e.g. the EV 10), the charging station which charges the secondary battery (e.g. the charging station 20), the controller (not shown) of the secondary battery, and the terminal (not shown) of the owner of the secondary battery, and transmits it to the battery database management server 300. The user front server 30 also receives the collection conditions of the secondary battery from the battery collecting support server 200, and transmits them to the terminal (not shown) of the owner of the secondary battery, the vehicle mounted with a secondary battery (e.g. the EV 10), the charging station which charges the secondary battery (e.g. the charging station 20), the controller (not shown) of the secondary battery, and the like. The user front server 30 is, for example, a Web server.

The vendor front server 50 receives the foregoing specification data from the vendor terminal 40 and transmits it to the remanufacturing support server 100. Upon receiving the remanufacturing plan based on the specification data from the remanufacturing support server 100, the vendor front server 50 transmits it to the vendor terminal 40. The vendor front server 50 is, for example, a Web server.

The remanufacturing support server 100, battery collecting support server 200 and battery database management server 300 will be described in detail below.

FIG. 2 is a block diagram illustrating the remanufacturing support server 100 illustrated in FIG. 1. As illustrated in FIG. 2, the remanufacturing support server 100 includes a specification data acquisition unit 101, an allowable range setting unit 102, a required battery number determination unit 103, a database searching unit 104, a remanufacturing plan creation unit 105 and a remanufacturing plan providing unit 106.

The specification data acquisition unit 101 acquires specification data received from the vendor terminal 40 via, for example, the vendor front server 50. When the remanufacturing support server 100 is directly accessible from the vendor terminal 40, the specification data transmitted from the vendor terminal 40 can be received by the remanufacturing support server 100 without passing through the vendor front server 50. The specification data acquisition unit 101 transmits the acquired specification data to the allowable range setting unit 102 and the required battery number determination unit 103. The specification data represents the required performance of a battery product which is planned to be remanufactured by a vendor using a used secondary battery as a member. The required performance may include, for example, the life required for the battery product and/or the battery capacity required for the battery product.

The allowable range setting unit 102 receives the specification data from the specification data acquisition unit 101 and, based on the specification data, sets a range of a degradation state that is allowable (hereinafter referred to as "allowable range") as a member of the battery product to be remanufactured. That is, the allowable range setting unit 102 sets a range that is allowable as a degradation state of the secondary battery for use in the battery product. For example, if the specification data includes the life required for the battery product, the secondary battery allowable as a member of the battery product can be used normally for a period longer than the required life. The allowable range setting unit 102 may thus set the allowable range not to fall below the life required for the battery product. The allowable range setting unit 102 notifies the database searching unit 104 of the set allowable range.

The required battery number determination unit 103 receives specification data from the specification data acquisition unit 101 and, based on the specification data, determines the number of secondary batteries required (also referred to as the required number hereinafter) as members of a battery product to be remanufactured. For example, if the specification data includes the battery capacity required for the battery product, the required battery number determination unit 103 may, for example, divide the battery capacity by the battery capacity per one secondary battery to determine the required number based on the result. The battery capacity per one secondary battery can be calculated, for example, based on the battery capacity of the secondary battery that is in a degradation state corresponding to the lower limit of the range set by the allowable range setting unit 102. The required battery number determination unit 103 notifies the database searching unit 104 of the determined required battery number.

The database searching unit 104 creates a search request for the battery database based on the allowable range set by the allowable range setting unit 102, and causes the battery database management server 300 to perform a database search based on the search request. The database searching unit 104 transmits the search result of the battery database to the remanufacturing plan creation unit 105.

The battery database registers an identifier for identifying a secondary battery mounted on a vehicle using electricity as at least part of an energy source, such as the EV 10 and diagnostic data indicating a diagnostic result of a degradation state of the secondary battery which is identified by the identifier (or which corresponds to the identifier) in association with each other.

Specifically, the database searching unit 104 searches for the identifier of a secondary battery associated with diagnostic data indicating a diagnostic result that falls within the allowable range set by the allowable range setting unit 102. Then, the database searching unit 104 acquires the database search result from the battery database management server 300. The database search result acquired by the database searching unit 104 is diagnostic data indicating a diagnostic result of a degradation state of a secondary battery mounted on a vehicle, and the diagnostic result falls within a range allowed as the degradation state of the secondary battery.

Note that the battery database may further register, in association with the identifier, date/time data indicating date and time when the degradation state diagnosis corresponding to the diagnosis data was performed for the secondary battery corresponding to the identifier. The database searching unit 104 may use the date/time data to exclude a secondary battery which has long elapsed since the last diagnosis, from the search result. For example, the database searching unit 104 may create a search request using the foregoing allowable range and a reference date and time of, for example, 3 months ago, and search for an identifier associated with diagnostic data indicating a diagnostic result falling within the allowable range and date/time data indicating that a diagnosis of a degradation state corresponding to the diagnostic data was performed at a date and time which is later than the reference date and time. It is thus possible to prevent a situation in which the collected secondary battery cannot be used as a member of a battery product to be remanufactured because it is degraded more than the degradation state indicated by the diagnostic data.

The battery database may also register various items of battery-related data other than the diagnostic data and date/time data in association with the identifier. For example, data regarding the owner of a secondary battery and data regarding a vehicle mounted with a secondary battery may be registered in the battery database. The data relating to the owner of a secondary battery may include destination data of collection conditions of the secondary battery, an attribute of the owner, and the like. The destination data may be an e-mail address, a telephone number, an address, an SNS account name, and the like. The attribute of the owner may be, for example, a job description of the owner. When the owner is engaged in a business using a large number of vehicles, such as taxis, buses, transportation, rental cars and car sharing, used secondary batteries can be collected at a time, so that the attribute of the owner may be considered in determining collection conditions to be described later. Data on a vehicle mounted with a secondary battery may include, for example, a type, a model year and a mileage of the vehicle. For an older and longer mileage vehicle, data on the vehicle may be considered in determining collections conditions to be described below because the owner is likely to consider scrapping the vehicle.

In addition, the database searching unit 104 may restrict the upper limit of the total number of identifiers, which can be included in the database search results, in accordance with the required number determined by the required battery number determination unit 103. Since, therefore, the battery database management server 300 ends the search of the battery database when the total number of identifiers obtained reaches the upper limit, the load on the system is reduced.

The remanufacturing plan creation unit 105 receives the search result of the battery database from the database searching unit 104. Then, based on the search result, the remanufacturing plan creation unit 105 creates a remanufacturing plan related to a battery product as a response to the specification data. The remanufacturing plan creation unit 105 sends a remanufacturing plan to the remanufacturing plan providing unit 106.

The remanufacturing plan may include, for example, the specifications, costs and delivery date of the battery product. As these elements, a definite value of yen, day, etc. need not be presented but a range of yen, the shortest days, etc. may be presented. If the range is presented as an element of the remanufacturing plan, it is unlikely that the cost or the delivery date will exceed the plan when a secondary battery is difficult to collect.

The remanufacturing plan creation unit 105 can determine the specifications of the battery product, such as the capacity and the life, based on the total number of identifiers obtained and/or the life of the secondary battery corresponding to the identifiers. The remanufacturing plan creation unit 105 can calculate the cost and/or delivery date of the battery product based on the total number of identifiers obtained, the attribute of the owner of the secondary battery corresponding to the identifiers, and/or data regarding the vehicle mounted with the secondary battery.

When the total number of identifiers obtained from the database is smaller than the required number determined by the required battery number determination unit 103, it is not possible to immediately acquire a secondary battery serving as a member of a battery product that satisfies the vendor's required specifications. The remanufacturing plan creation unit 105 may create a notification that a member necessary for the requested battery product is difficult/impossible to obtain, a proposal for the specifications of an alternative battery product using a currently obtainable secondary battery as a member, a proposal to decrease the required performance, etc., and send these to the remanufacturing plan providing unit 106 in place of the remanufacturing plan.

The remanufacturing plan providing unit 106 receives the remanufacturing plan from the remanufacturing plan creation unit 105 and provides it for the vendor terminal 40 via the vendor front server 50. If, therefore, the remanufacturing plan creation unit 105 and the remanufacturing plan providing unit 106 perform a process, the remanufacturing plan related to the battery product based on the diagnostic data acquired by the database searching unit 104 is provided for the outside. When the remanufacturing support server 100 can directly gain access to the vendor terminal 40, the remanufacturing plan transmitted by the remanufacturing support server 100 can be received by the vendor terminal 40 without using the vendor front server 50.

After the vendor agrees with the remanufacturing plan, the remanufacturing plan providing unit 106 can provide the battery collecting support server 200 with a remanufacturing plan including the search result of the battery database. The remanufacturing plan may include, for example, the allowable range set by the allowable range setting unit 102 and/or the required number determined by the required battery number determining unit 103, or may include a search request used by the database searching unit 104, instead of the search result of the battery database. In this case, the battery collecting support server 200 may cause the battery database management server 300 to search the battery database in order to specify a collectable secondary battery.

FIG. 3 is a block diagram illustrating the battery collecting support server 200 illustrated in FIG. 1. As illustrated in FIG. 3, the battery collecting support server 200 includes a remanufacturing plan acquisition unit 201, a collection condition determination unit 202 and a collection condition providing unit 203.

The remanufacturing plan acquisition unit 201 acquires a remanufacturing plan including the search result of the battery database from the remanufacturing support server 100. The remanufacturing plan acquisition unit 201 transmits the acquired remanufacturing plan to the collection condition determination unit 202. The remanufacturing plan acquisition unit 201 acquires battery data of a secondary battery that can be collected as a member of a secondary battery for use in a battery product, as the search result of the battery database.

The collection condition determination unit 202 receives the remanufacturing plan including the search result of the battery database from the remanufacturing plan acquisition unit 201. Then, based on the search result of the battery database, the collection condition determination unit 202 determines a collection condition for each of the identifiers included in the search result or for each group of the identifiers in order to collect secondary batteries corresponding to the identifiers. The group may include, for example, secondary batteries which are owned by the same owner and which are in similar degradation states. The collection condition determination unit 202 transmits the determined collection condition to the collection condition providing unit 203.

Based on diagnostic data of a secondary battery corresponding to an identifier included in the search result, data concerning the owner of the secondary battery, and/or data concerning a vehicle mounted with the secondary battery, the collection condition determination unit 202 may determine the collection condition of the secondary battery.

The collection of a secondary battery may include both purchasing the secondary battery and replacing the secondary battery with another secondary battery. Furthermore, replacing a secondary battery with another secondary battery may include both replacing a secondary battery with another secondary battery that is excellent in performance and replacing a secondary battery with another secondary battery that is inferior in performance and the like. In the former case, the owner of a secondary battery can exchange (upgrade) the secondary battery at a price lower than the trade-in price of the secondary battery. In the latter case, the owner of the secondary battery can receive monetary compensation, though the performance of the owner's secondary battery will be lowered.

The collection condition may include the amount of money for collecting secondary batteries and/or the expiration date of the collection condition. The amount of money can be, for example, the amount of money to be paid to the owner of a secondary battery when the secondary battery is purchased from the owner, the amount of money to be paid by the owner of a secondary battery when it is replaced with (upgraded to) another secondary battery, the amount of money to be paid to the owner of a secondary battery when it is replaced (downgraded to) with another secondary battery, and the like.

The collection condition providing unit 203 receives the collection condition of the secondary battery from the collection condition determination unit 202 to provide it for the owner of the secondary battery via the user front server 30. Specifically, the collection condition may be provided to, for example, a terminal (not shown) of the owner, a vehicle (e.g. EV 10) of the owner, a charging station (e.g. charging station 20) which charges the owner's secondary battery, a controller of the secondary battery, and the like. The collection condition may be displayed as a message on a display attached to the terminal, the vehicle, the charging station, and the like, or may be output as an audio guide from a speaker attached thereto. When the battery collecting support server 200 can gain direct access to the terminal of the owner and the like, the collection condition transmitted by the battery collecting support server 200 can be received by the terminal of the owner without using the user front server 30.

Figure 4A:
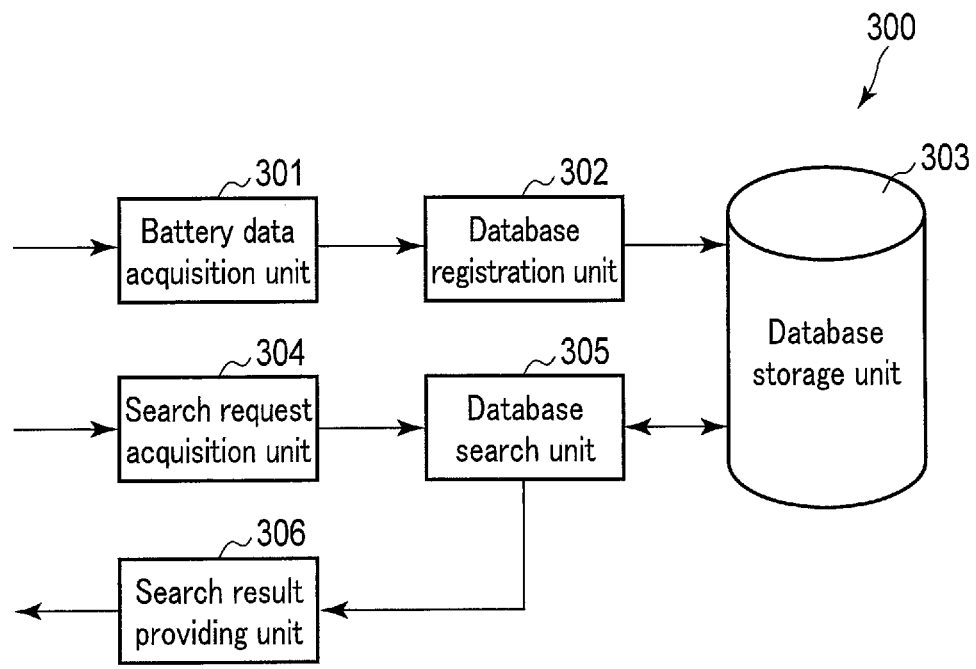
FIG. 4A is a block diagram illustrating the battery database management server illustrated in FIG. 1.

FIG. 4A is a block diagram illustrating the battery database management server 300 illustrated in FIG. 1. As illustrated in FIG. 4A, the battery database management server 300 includes a battery data acquisition unit 301, a database registration unit 302, a database storage unit 303, a search request acquisition unit 304, a database search unit 305 and a search result providing unit 306.

The battery data acquisition unit 301 acquires battery data including an identifier which identifies a secondary battery mounted on a vehicle using electricity as at least part of an energy source and diagnostic data indicating a diagnostic result of a degradation state of the secondary battery. The battery data may be received via the user front server 30 from a terminal (not shown) of the owner of the secondary battery, a vehicle (e.g. EV 10) mounted with the secondary battery, a charging station (e.g. the charging station 20) which charges the secondary battery, a controller for the secondary battery, and the like. The battery data acquisition unit 301 transmits the acquired battery data to the database registration unit 302.

The diagnostic data can be generated by estimation of internal state parameter and battery characteristic parameter of the secondary battery based on the result of charge curve analysis or discharge curve analysis of the secondary battery and by safety diagnosis based on the estimation. The charge curve analysis and/or discharge curve analysis can be conducted, for example, based on measurement data acquired when a vehicle mounted with a secondary battery stops at a parking lot and is connected to a charging station.

The measurement data represents measurement results of electrical characteristics of the secondary battery at a plurality of points in time during charging/discharging of the secondary battery. The electrical characteristics include a voltage between positive and negative electrode terminals of the secondary battery which can be measured by a voltmeter, and a current that flows through the secondary battery which can be measured by an ammeter.

The internal state parameter may include, for example, some or all of positive electrode capacity (or positive electrode mass), negative electrode capacity (or negative electrode mass), initial charge amount of the positive electrode, initial charge amount of the negative electrode, and internal resistance.

The battery characteristic parameter may include, for example, some or all of an open circuit voltage (OCV), an OCV curve and battery capacity. In addition, the foregoing internal resistance may also be included in the battery characteristic parameter. The OCV curve represents a function indicating a relationship between some index other than the OCV of a target battery, such as an internal parameter and a battery characteristic parameter, and its corresponding OCV. The battery capacity corresponds to the overlapping portion between the range of the positive electrode capacity, namely, the range from the initial charge amount to the upper limit charge amount of the positive electrode, and the range of the negative electrode capacity, namely, the range from the initial charge amount to the upper limit charge amount of the negative electrode.

The parameter estimation and/or the safety diagnosis may be performed by a terminal (not shown) of the owner of the secondary battery, a vehicle (e.g. EV 10) mounted with the secondary battery, a charging station (e.g. charging station 20) which charges the secondary battery, a controller for the secondary battery, and the like, or may be performed by the battery database management server 300 or another server not shown. In the latter case, the battery database management server 300 or another server receives measurement data instead of diagnostic data.

The database registration unit 302 receives battery data from the battery data acquisition unit 301 and registers other data included in the battery data, such as diagnostic data and date-and-time data, in the battery database constructed in the database storage unit 303, in association with an identifier included in the battery data.

The database storage unit 303 stores the foregoing battery database. The database registration unit 302 adds an entry (battery data) to, changes an entry in or deletes an entry from the battery database. The database search unit 305 can search the battery database for an entry.

The search request acquisition unit 304 acquires a search request from the remanufacturing support server 100. The search request acquisition unit 304 sends the acquired search request to the database search unit 305.

The database search unit 305 receives the search request from the search request acquisition unit 304 to search the battery database constructed in the database storage unit 303. The database search unit 305 sends a search result of the battery database to the search result providing unit 306.

The search result providing unit 306 receives the search result of the battery database from the database search unit 305 and provides it for the remanufacturing support server 100.

Figure 4B:
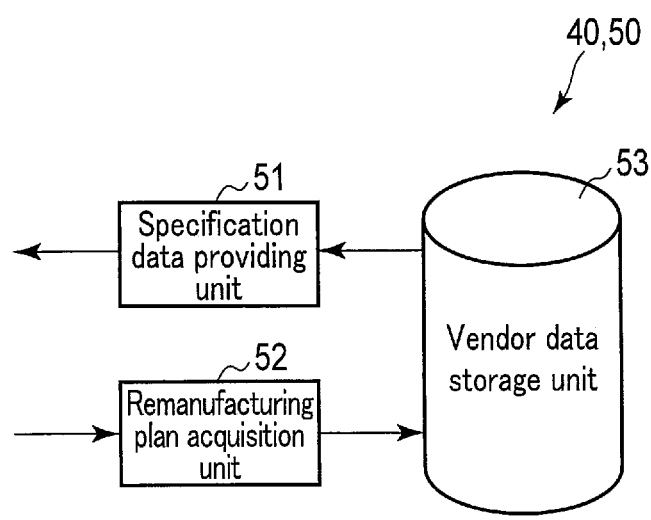
FIG. 4B is a block diagram illustrating a vendor computer configured by a vendor front server, a vendor terminal and the like in FIG. 1.

FIG. 4B is a block diagram illustrating a vendor computer configured by the vendor front server 50, vendor terminal 40 and the like in FIG. 1. As illustrated in FIG. 4B, the vendor computer includes a specification data providing unit 51, a remanufacturing plan acquisition unit 52 and a vendor data storage unit 53.

The specification data providing unit 51 transmits the foregoing specification data representing the required performance of a battery product, which is to be remanufactured by a vendor, to the remanufacturing support server 100. That is, the specification data providing unit 51 provides the specification data for the outside of the vendor computer.

The remanufacturing plan acquisition unit 52 receives a remanufacturing plan created as described above from the remanufacturing support server 100 and acquires a remanufacturing plan of the battery product. As described above, the remanufacturing plan is created by the remanufacturing support server 100 using the specification data provided from the vendor computer. The remanufacturing plan includes battery data of a secondary battery that can be collected as a secondary battery for use in the battery product.

The vendor data storage unit 53 stores data related to the vendor. The vendor-related data can be added, changed or deleted. Also, the vendor-related data may be retrieved. The vendor-related data includes the foregoing specification data, remanufacturing plan and the like.

Figure 4C:
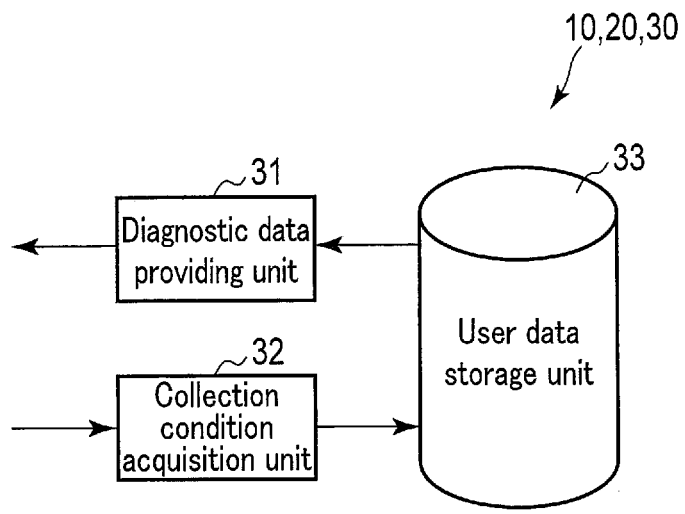
FIG. 4C is a block diagram illustrating a user computer configured by a user front server, a computer installed in an EV, a computer installed in a charging station, an owner's terminal of the EV and the like in FIG. 1.

FIG. 4C is a block diagram illustrating a user computer configured by the user front server 30, a computer installed in the EV 10, a computer installed in the charging station 20, an owner's terminal of the EV 10 and the like in FIG. 1. As illustrated in FIG. 4C, the user computer includes a diagnostic data providing unit 31, a collection condition acquisition unit 32 and a user data storage unit 33.

The diagnostic data providing unit 31 transmits the foregoing diagnostic data indicating a result of degradation diagnosis of the secondary battery mounted on the vehicle to the battery database management server 300. That is, the diagnostic data providing unit 31 provides the diagnostic data for the outside of the user computer.

The collection condition acquisition unit 32 receives and acquires the collection conditions for collecting the secondary battery of the vehicle prepared as created above from the battery collecting support server 200. As described above, the collection conditions are created by the battery collecting support server 200 using the diagnostic data provided from the user computer.

The user data storage unit 33 stores data related to the user, namely, data related to the owner of the vehicle. The user-related data can be added, changed or deleted. The user-related data can also be retrieved. In addition, the user-related data includes the foregoing diagnostic data and collection conditions, and the like.

Figure 7:
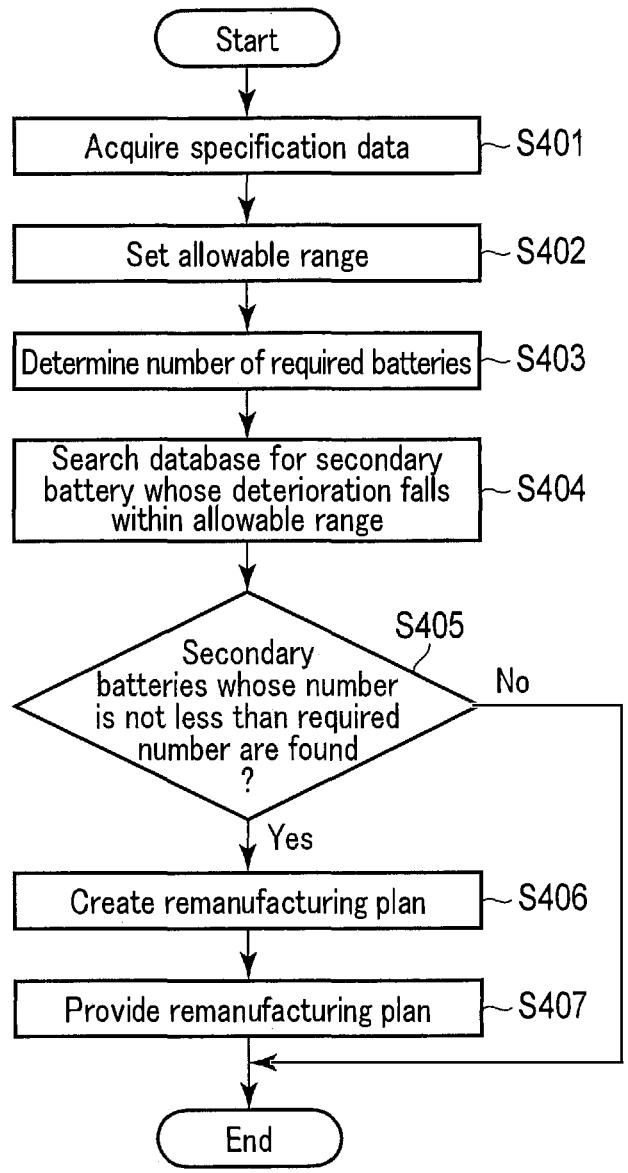
FIG. 7 is a flowchart illustrating the operation of the remanufacturing support server illustrated in FIG. 2.

FIG. 7 is a flowchart illustrating the operation of the remanufacturing support server 100 illustrated in FIG. 2. An example of the operation of the remanufacturing support server 100 will be described below with reference to FIG. 7.

First, the specification data acquisition unit 101 acquires specification data from the vendor terminal 40 (step S401).

On the basis of the specification data acquired in step S401, the allowable range setting unit 102 sets an allowable range of a degradation state of members of a battery product to be remanufactured (step S402). On the basis of the specification data acquired in step S401, the required battery number determination unit 103 determines the number of secondary batteries required as the members of the battery product to be remanufactured (step S403). Note that steps 402 and 403 may be performed in the reverse order to that in FIG. 7 or in parallel with each other.

The database search unit 104 searches the battery database managed by the battery database management server 300 for battery data of a secondary battery whose degradation state falls within the allowable range set in step S402 (step S404). If battery data of secondary batteries the number of which is not less than the required number determined in step S403 is found by the search in step S404 (Yes in step S405), the process proceeds to step S406. If not (No in step S405), the operation shown in FIG. 7 ends.

Even though the total number of secondary batteries found by the search in step 404 is less than the required number, the remanufacturing plan creation unit 105 may create a notification that members necessary for the required battery product are difficult/impossible to obtain, a proposal for specifications of an alternative battery product using the currently obtainable secondary battery as a member, a proposal to decrease the required performance, and the like as described above, and the remanufacturing plan providing unit 106 may provide these for the outside, such as a vendor and an intermediate agent.

In step S406, in response to the specification data acquired in step S401, the remanufacturing plan creation unit 105 creates a remanufacturing plan for a battery product based on a result of the search in step S404. Then, the remanufacturing plan providing unit 106 provides the remanufacturing plan created in step S406 for the outside, such as a vendor and an intermediate agent (step S407), and the operation shown in FIG. 7 ends.

Figure 8:
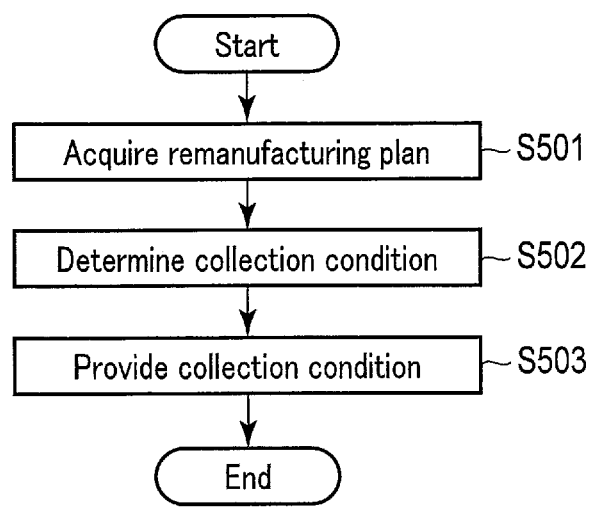
FIG. 8 is a flowchart illustrating the operation of the battery collecting support server illustrated in FIG. 3.

FIG. 8 is a flowchart illustrating the operation of the battery collecting support server 200 illustrated in FIG. 3. An example of the operation of the battery collecting support server 200 will be described below with reference to FIG. 8.

First, the remanufacturing plan acquisition unit 201 acquires a remanufacturing plan including the search result of the battery database, from the remanufacturing support server 100 (step S501).

For each of the identifiers or each group of the identifiers included in the search result of the battery database acquired in step S501, the collection condition determination unit 202 determines a collection condition for collecting secondary batteries corresponding to the identifiers based on the search result (step S502). Then, the collection condition providing unit 203 provides the collection condition determined in step S502 for the owner of a secondary battery having the determined collection condition (Step S503), and the operation shown in FIG. 8 ends.

Figure 9:
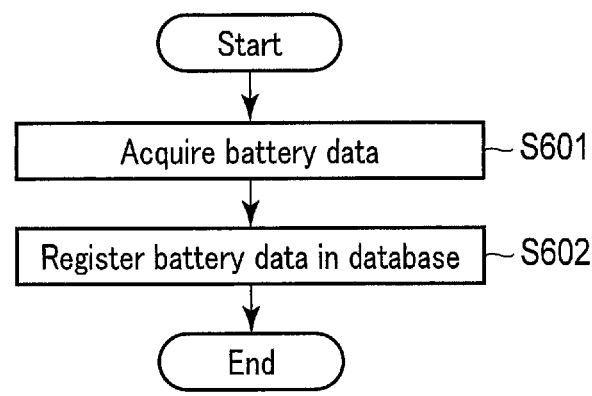
FIG. 9 is a flowchart illustrating the operation of the battery database management server illustrated in FIG. 4A for registering battery data in the battery database.

FIG. 9 is a flowchart illustrating the operation of the battery database management server 300 illustrated in FIG. 4A for registering battery data in the battery database. An example of the operation of the battery database management server 300 for registering battery data in the battery database will be described below with reference to FIG. 9.

First, the battery data acquisition unit 301 acquires battery data of a secondary battery from a terminal (not shown) of the owner of the secondary battery, a vehicle (e.g. EV 10) mounted with the secondary battery, a charging (e.g. the charging station 20) which charges the secondary battery, a controller for the secondary battery, and the like (step S601).

Then, the database registration unit 302 registers the battery data acquired in step S601 in the battery database constructed in the database storage unit 303 (step S602), and the operation shown in FIG. 9 ends.

As has been described above, on the basis of specification data indicating the required performance of a battery product to be remanufactured by a vendor using a used secondary battery as a member, the remanufacturing support server according to the embodiment sets an allowable range of a degradation state of members of the battery product, searches the battery database for battery data of a secondary battery whose degradation state falls within the allowable range, creates a remanufacturing plan for the battery product based on the search result, and provides it for the outside such as a vendor and an intermediate agent. The remanufacturing support server can thus support the remanufacturing of the secondary battery.

In addition, the battery collection support server according to the embodiment determines a collection condition for collecting a secondary battery included in the search result of the battery database on the basis of the remanufacturing plan including the search result, and provides the collection condition for the owner of the secondary battery. The battery collection support server can thus support the remanufacturing of the secondary battery.

Furthermore, the battery database management server according to the embodiment collects battery data including an identifier for identifying a secondary battery mounted on a vehicle and diagnostic data indicating a diagnosis result of a degradation state of the secondary battery, and registers the battery data in the battery database. In response to a search request from the remanufacturing support server according to the embodiment, the battery database management server returns, to the remanufacturing support server, a search result including battery data of a secondary battery that can be collected as a member of a battery product to be remanufactured by a vendor using a used rechargeable battery as a member. The battery database management server can thus support the remanufacturing of the secondary battery.

As illustrated in FIG. 6, the secondary batteries such as LIB may vary in degradation state depending on their use conditions such as the operating conditions of vehicles. FIG. 6 is a chart illustrating degradation states of different secondary batteries that can be collected by the secondary battery reuse system illustrated in FIG. 1. In the example illustrated in FIG. 6, the degradation states of secondary batteries B11, B12 and B13 mounted on EVs 11, 12 and 13 respectively progress at different speeds. Therefore, for example, the secondary batteries B11 (t11), B12 (t21) and B13 (t31) collected after the owners of the secondary batteries B11, B12 and B13 replaced the secondary batteries or scrapped vehicles mounted with the secondary batteries (t11, t21 and t31) vary in degradation state. On the other hand, the secondary battery reuse system including the remanufacturing support server, battery collection support server and battery database management server can propose collecting the secondary batteries before the owner replaces the secondary batteries or scraps the vehicles (at t10, t20 and t30). The secondary battery reuse system can thus make it possible to efficiently obtain secondary batteries B11 (t10), B12 (t20) and B13 (t30) whose degradation states are uniformed to some extent. That is, the secondary battery reuse system makes it possible to support the remanufacturing of the secondary battery. In addition, it is considered that the secondary batteries collected as a result of replacement of the secondary batteries or scrapping of the vehicles will typically be degraded to some extent. However, the secondary battery reuse system can propose collecting secondary batteries even if the secondary batteries are not generally available in the market or not degraded so much.

While certain functional units have been described in the foregoing embodiment, these functional units have been presented by way of example only. For example, a plurality of functional units, which have been described as being implanted in a single device, may be implanted in different devices, and a functional unit, which has been described as being implanted in different devices, may be implanted in a single device.

The functional units described in the foregoing embodiment may be implemented by using a circuit. The circuit may be a dedicated circuit that implements a specific function or may be a general-purpose circuit such as a processor.

At least some of the processes of the above embodiment can be achieved by using, for example, a processor such as a CPU and/or a GPU, a microcomputer, an FPGA and a DSP, which are mounted on a general-purpose computer, as basic hardware. The program for performing the processes may be provided while being stored in a non-transitory computer-readable recording medium. The program is stored in the recording medium as a file in an installable format or as a file in an executable format. The non-transitory recording medium may be a magnetic disk, an optical disk (CD-ROM, CD-R, DVD, etc.), a magneto-optical disk (MO, etc.), a semiconductor memory, and the like. The recording medium may be any recording medium as long as it can store a program and it is computer-readable. In addition, the program for performing the processes may be stored on a computer (server) connected to a network such as the Internet and downloaded to a computer (client) via the network.

Specifically, the remanufacturing support server 100, battery collecting support server 200 and battery database management server 300 according to the embodiment each can be achieved by a computer. The computer includes a processor and a memory and may further include a communication interface (I/F), an auxiliary storage device, an input/output (I/O) and the like. The processor executes the programs developed in the memory to be allowed to function as, for example, the specification data acquisition unit 101, allowable range setting unit 102, required battery number determination unit 103, database searching unit 104, remanufacturing plan creation unit 105, remanufacturing plan providing unit 106, remanufacturing plan acquisition unit 201, collection condition determination unit 202, collection condition providing unit 203, battery data acquisition unit 301, database registration unit 302, search request acquisition unit 304, database search result provision unit 305, and/or search result provision unit 306. The memory and/or the auxiliary storage device may include the database storage unit 303.

A method to be executed and a program for performing a process in the foregoing embodiment and the like will be added as follows.

(Appendix 1)

A remanufacturing support method comprising:
acquiring specification data representing required performance of a battery product;
setting an allowable range of a degradation state of a secondary battery to be used in the battery product;
acquiring diagnostic data indicating a diagnostic result of a degradation state of a secondary battery mounted on a vehicle, the diagnostic result of the degradation state of the secondary battery falling within the allowable range as the battery product; and
providing an outside with a remanufacturing plan relating to the battery product based on the diagnostic data.

(Appendix 2)

A non-transitory storage medium storing a remanufacturing support program which causes a computer to:
acquire specification data representing required performance of a battery product;
set an allowable range of a degradation state of a secondary battery to be used in the battery product;
acquire diagnostic data indicating a diagnostic result of a degradation state of a secondary battery mounted on a vehicle, the diagnostic result of the degradation state of the secondary battery falling within the allowable range as the battery product; and
provide an outside with a remanufacturing plan relating to the battery product based on the diagnostic data.

(Appendix 3)

A battery collection support method comprising:
acquiring a remanufacturing plan of a battery product including battery data of a secondary battery which is collectable to be used in the battery product; and
providing a collection condition to collect a first secondary battery corresponding to first battery data included in the battery data of the collectable secondary battery, for an owner of the first secondary battery.

(Appendix 4)

A non-transitory storage medium storing a battery collection support program which causes a computer to:
acquire a remanufacturing plan of a battery product including battery data of a secondary battery which is collectable to be used in the battery product; and
provide a collection condition to collect a first secondary battery corresponding to first battery data included in the battery data of the collectable secondary battery, for an owner of the first secondary battery.

(Appendix 5)

A battery database management method comprising:
acquiring battery data including diagnostic data representing a diagnostic result of a degradation state of a secondary battery mounted on a vehicle; and
registering the diagnostic data included in the battery data, in a database.

(Appendix 6)

A non-transitory storage medium storing a battery database management program which causes a computer to:

acquire battery data including diagnostic data representing a diagnostic result of a degradation state of a secondary battery mounted on a vehicle; and register the diagnostic data included in the battery data, in the database.

(Appendix 7)

A processing method comprising:

providing an outside with specification data representing required performance of a battery product; and acquiring a remanufacturing plan of the battery product which includes battery data of a secondary battery that is collectable to be used in the battery product and which is created using the specification data.

(Appendix 8)

A non-transitory storage medium storing a processing program which causes a computer to:

provide an outside with specification data representing required performance of a battery product; and acquire a remanufacturing plan of the battery product which includes battery data of a secondary battery that is collectable to be used in the battery product and which is created using the specification data.

(Appendix 9)

A processing method comprising:

providing an outside with diagnostic data representing a diagnostic result of a degradation state of a secondary battery mounted on a vehicle; and acquiring a collection condition to collect the secondary battery of the vehicle, which is created using the diagnostic data.

(Appendix 10)

A non-transitory storage medium storing a processing program which causes a computer to:

provide an outside with diagnostic data representing a diagnostic result of a degradation state of a secondary battery mounted on a vehicle; and acquire a collection condition to collect the secondary battery of the vehicle, which is created using the diagnostic data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of

What is claimed is:

1. A remanufacturing support server, comprising:
processing circuitry configured to
acquire specification data representing required performance of a battery product, the battery product being a different product from a vehicle, wherein one or more secondary batteries, which have been used in vehicles, are planned to be mounted on the battery product;
set an allowable range of a degradation state of the one or more secondary batteries planned to be mounted on the battery product, based on the acquired specification data;
search for one or more particular secondary batteries, whose degradation states fall within the set allowable range, based on diagnostic data indicating degradation states of secondary batteries that have been used in vehicles;
create a remanufacturing plan of the battery product, the remanufacturing plan representing the found one or more particular secondary batteries, whose degradation states fall within the allowable range, as the one or more secondary batteries planned to be mounted on the battery product; and
send, to a battery collection support server, the created remanufacturing plan.

2. The remanufacturing support server of claim 1, wherein:
the required performance includes a lifetime required for the battery product; and
the processing circuitry is further configured to set the allowable range of the degradation state of the secondary batteries planned to be mounted on the battery product to be equal to or greater than the lifetime required for the battery product.

3. The remanufacturing support server of claim 1, wherein the processing circuitry is further configured to
search a database, which registers diagnostic data indicating a degradation state of a certain secondary battery mounted on a certain vehicle, for diagnostic data indicating the diagnostic result of the degradation state of the secondary battery, which falls within the allowable range as the battery product; and
create the remanufacturing plan based on a result of the search of the database including the acquired diagnostic data.

4. The remanufacturing support server of claim 3, wherein:
the required performance includes a battery capacity required for the battery product; and
the processing circuitry is further configured to
determine a number of the one or more secondary batteries required for the battery product, based on the battery capacity required for the battery product; and
create the remanufacturing plan when a number of items of diagnostic data indicating the diagnostic result of the degradation state of the certain secondary battery, which falls within the allowable range as the battery product, is equal to or larger than the number of the one or more secondary batteries required for the battery product, as a result of the search of the database.

5. The remanufacturing support server of claim 3, wherein:
date and time data, indicating a date and a time when a degradation state diagnosis corresponding to the diagnosis data was performed for the secondary battery is registered in the database; and
the processing circuitry is further configured to search for battery data including diagnostic data indicating the diagnostic result of the degradation state of the certain secondary battery, which falls within the allowable range as the battery product, and the date and time data indicating that a diagnosis of a degradation state corresponding to the diagnostic data was performed at the date and the time that is later than a reference date and time.

6. The battery collection support server, which is used with the remanufacturing support server according to claim 1, the battery collection support server, comprising:

a first circuitry configured to
receive the information regarding the remanufacturing plan of the battery product from the manufacturing support server; and
send information regarding a collection condition to collect a first secondary battery to an outside device, the first secondary battery being one of the one or more particular secondary batteries mounted on the battery product in the remanufacturing plan.

7. The battery collection support server of claim 6, wherein:
the first circuitry is further configured to acquire battery data included in the remanufacturing plan as a result of the search for the one or more secondary batteries that is collectable as the one or more secondary batteries to be used in the battery product, from a database in which battery data of a certain secondary battery mounted on a certain vehicle is registered; and
the first circuitry is further configured to determine the collection condition to collect the first secondary battery, based on the result of the search from the database.

8. The battery collection support server of claim 7, wherein the first circuitry is further configured to determine the collection condition based on at least one of diagnostic data of the first secondary battery, data regarding an owner of the first secondary battery, and data regarding a particular vehicle mounted with the first secondary battery.

9. The battery collection support server of claim 6, wherein the collection condition includes at least one of an amount of money to purchase the first secondary battery, an amount of money to be paid by an owner of the first secondary battery when the first secondary battery is replaced with a second secondary battery, an amount of money to be paid to the owner of the first secondary battery when the first secondary battery is replaced with a third secondary battery, and an expiration date of the collection condition.

10. A battery database management server, which is used with the remanufacturing support server according to claim 1, the battery database management server comprising circuitry configured to
acquire battery data including the diagnostic data representing the degradation states of the secondary batteries that have been used in the vehicles; and
register the diagnostic data included in the battery data, in a database.

11. The battery database management server of claim 10, wherein the diagnostic data included in the battery data is created by one of a controller of certain a secondary battery corresponding to the battery data and a charging apparatus that charges the certain secondary battery, based on a result of a charging curve analysis of the secondary battery.

12. The battery database management server of claim 10, wherein the circuitry is further configured to register date and time data indicating a date and a time when a degradation state diagnosis corresponding to the diagnosis data was performed for the secondary batteries.

13. A vendor computer, which is used with the remanufacturing support server of claim 1, the vendor computer comprising circuitry configured to:
transmit the specification data representing the required performance of the battery product to the remanufacturing support server; and
receive, from the remanufacturing support server, the remanufacturing plan of the battery product.

14. A user computer, which is used with the battery collection support server of claim 6, the user computer comprising second circuitry configured to:
transmit the diagnostic data representing the degradation states of the secondary batteries that have been used in the vehicles to an outside device; and
receive from the battery collection support server, the collection condition to collect the first secondary battery.

15. A system, comprising:
a remanufacturing support server, including first circuitry configured to
acquire specification data representing required performance of a battery product, the battery product being a different product from a vehicle, wherein one or more secondary batteries, which have been used in vehicles, are planned to be mounted on the battery product;
set an allowable range of a degradation state of the secondary batteries planned to be mounted on the battery product, based on the acquired specification data;
search for one or more particular secondary batteries, whose degradation states fall within the set allowable range, based on diagnostic data indicating degradation states of secondary batteries that have been used in vehicles;
create a remanufacturing plan of the battery product, the remanufacturing plan representing the found one or more particular secondary batteries, whose degradation states fall within the allowable range, as the one or more secondary batteries planned to be mounted on the battery product; and
send, to a battery collection support server, the created remanufacturing plan;
the battery collection support server including second circuitry configured to
receive the information regarding the remanufacturing plan of the battery product from the manufacturing support server; and
send information regarding a collection condition to collect a first secondary battery to an outside device, the first secondary battery being one of the one or more particular secondary batteries mounted on the battery product in the remanufacturing plan;
a battery database management server including third circuitry configured to
acquire battery data including the diagnostic data representing the degradation states of the secondary batteries that have been used in the vehicles; and
register the diagnostic data included in the battery data, in a database; and
a user computer including fourth circuitry configured to
transmit the diagnostic data representing the degradation states of the secondary batteries that have been used in the vehicles to an outside device; and
receive from the battery collection support server, the collection condition to collect the first secondary battery.

16. A remanufacturing support server, comprising processing circuitry configured to
acquire specification data representing required performance of a battery product;
set an allowable range of a degradation state of a secondary battery to be used in the battery product;
acquire diagnostic data indicating a degradation state of a secondary battery mounted on a vehicle, the diagnostic result of the degradation state of the secondary battery falling within the allowable range as the battery product; and provide an outside device with a remanufacturing plan relating to the battery product based on the diagnostic data, wherein the processing circuitry is further configured to search a database, which registers diagnostic data indicating a diagnostic result of a degradation state of a certain secondary battery mounted on a certain vehicle, for diagnostic data indicating the diagnostic result of the degradation state of the secondary battery, which falls within the allowable range as the battery product; and create the remanufacturing plan based on a result of the search of the database including the acquired diagnostic data;

wherein the required performance includes a battery capacity required for the battery product; and the processing circuitry is further configured to determine a number of secondary batteries required for the battery product, based on the battery capacity required for the battery product; and create the remanufacturing plan when a number of items of diagnostic data indicating the diagnostic result of the degradation state of the certain secondary battery, which falls within the allowable range as the battery product, is equal to or larger than the number of secondary batteries required for the battery product, as a result of the search of the database.

* * * * *